(12) United States Patent
Kamii et al.

(10) Patent No.: US 7,897,497 B2
(45) Date of Patent: Mar. 1, 2011

(54) OVERVOLTAGE-PROTECTED LIGHT-EMITTING SEMICONDUCTOR DEVICE, AND METHOD OF FABRICATION

(75) Inventors: Yasuhiro Kamii, Saitama (JP); Arei Niwa, Saitama (JP); Junji Sato, Saitama (JP); Mikio Tazima, Saitama (JP)

(73) Assignee: Sanken Electric Co., Ltd. (JP)

( * ) Notice: Subject to any disclaimer, the term of this patent is extended or adjusted under 35 U.S.C. 154(b) by 394 days.

(21) Appl. No.: 12/181,052

(22) Filed: Jul. 28, 2008

(65) Prior Publication Data

US 2008/0308823 A1 Dec. 18, 2008

Related U.S. Application Data

(63) Continuation of application No. PCT/JP2007/050923, filed on Jan. 22, 2007.

(30) Foreign Application Priority Data

Jan. 30, 2006 (JP) .............................. 2006-020242

(51) Int. Cl.
*H01L 21/22* (2006.01)

(52) U.S. Cl. .............................. 438/545; 257/E29.032; 438/45; 438/46; 438/47

(58) Field of Classification Search ................. 438/545, 438/45, 46, 47; 257/E29.032
See application file for complete search history.

(56) References Cited

U.S. PATENT DOCUMENTS

2005/0168899 A1 8/2005 Sato et al.

*Primary Examiner*—Bradley K Smith
*Assistant Examiner*—Amar Movva
(74) *Attorney, Agent, or Firm*—Woodcock Washburn LLP

(57) ABSTRACT

A light-generating semiconductor region is grown by epitaxy on a silicon substrate. The light-generating semiconductor region is a lamination of layers of semiconducting nitrides containing a Group III element or elements. The silicon substrate has a p-type impurity-diffused layer formed therein by thermal diffusion of the Group III element or elements from the light-generating semiconductor region as a secondary product of the epitaxial growth of this region on the substrate. The p-type impurity-diffused layer is utilized as a part of overvoltage protector diodes which are serially interconnected with each other and in parallel with the LED section of the device between a pair of electrodes.

20 Claims, 8 Drawing Sheets

US 7,897,497 B2

OVERVOLTAGE-PROTECTED LIGHT-EMITTING SEMICONDUCTOR DEVICE, AND METHOD OF FABRICATION

CROSS REFERENCE TO RELATED APPLICATIONS

This is a continuation of Application PCT/JP2007/050923, filed Jan. 22, 2007, which claims priority to Japanese Patent Application No. 2006-020242 filed Jan. 30, 2006.

BACKGROUND OF THE INVENTION

This invention relates to a light-emitting semiconductor device, or light-emitting diode (LED) in common parlance, and more specifically to an LED featuring provisions for protection against overvoltages. The invention also specifically concerns a method of fabricating such an overvoltage-protected LED.

A host of specialists in electroluminescence have focused their attention in recent years on nitride semiconductors as LED materials. LEDs built from these materials emit light in the wavelength range of 365-550 nanometers. These devices have, however, an inherent weakness in withstanding electrostatic breakdown, being susceptible to destruction when subjected to a voltage surge in excess of 100 volts. It might be contemplated to incorporate a discrete overvoltage or surge protector such as a diode or capacitor in one and the same package with the LED. This solution is unsatisfactory in consideration of the greater bulk of the resulting device caused by the addition of the discrete overvoltage protector.

More sophisticated solutions are found in U.S. Unexamined Patent Publication US-2005-0168899-A1. In one of the embodiments disclosed in this prior application, an overvoltage protector diode is built into the substrate of the LED and electrically connected reversely in parallel with the light-generating semiconductor layers. The overvoltage protector diode conducts when the LED is reverse biased, limiting the cathode-anode voltage of the LED to its forward voltage. However, the forward voltage of the overvoltage protector diode (voltage at which it is triggered into conduction) is as low as one volt or even less, so that the LED can withstand a correspondingly low reverse voltage. This prior art overvoltage-protected LED does not lend itself to use in applications (e.g., LED matrix) where it is required to withstand a higher reverse voltage.

The U.S. patent application cited above also teaches to provide an npn overvoltage-protector by creating a p- and an n-type semiconductor layer in preselected parts of an n-type silicon substrate by doping. The two additional dopings required made the fabrication of the overvoltage-protected LED unnecessarily time-consuming and costly.

SUMMARY OF THE INVENTION

The present invention has it as an object to protect an LED of the kind defined against higher reverse voltages than heretofore.

Another object of the invention is to make possible the manufacture of such an overvoltage-protected LED more easily and economically than heretofore.

Briefly stated in one aspect thereof, the present invention concerns a method of making an overvoltage-protected LED. There is first prepared a silicon substrate which is notionally divisible into an overvoltage protector section and an LED section, each extending between a first and a second opposite major surface of the substrate. The substrate has an n-type semiconductor region formed in its overvoltage protector section to a prescribed depth from the first major surface thereof and a p-type semiconductor region occupying the rest of the substrate. Then a light-generating semiconductor region is formed on the first major surface of the substrate by successively growing by epitaxy a first compound semiconductor layer of a first conductivity type and a second compound semiconductor layer of a second conductivity type. At least the first compound semiconductor layer of the light-generating semiconductor region contains a Group III element or elements of the Periodic Table.

During this epitaxial growth of the light-generating semiconductor region, there occurs a thermal migration or a thermal diffusion of the Group III element or elements from the first compound semiconductor layer of the light-generating semiconductor region into the substrate, resulting in the creation of a secondary product in the form of the p-type impurity-diffused layer or the p-type semiconductor layer in the substrate. The impurity-diffused layer of the substrate is created to a depth less than that of the n-type semiconductor region of the substrate from the first major surface of the substrate.

Then the light-generating semiconductor region is removed in part from over the first major surface of the substrate thereby exposing part of the p-type impurity-diffused layer of the substrate. Then, by creating a trench such as that of annular shape in the exposed part of the first major surface of the substrate, the p-type impurity-diffused layer is electrically separated into an overvoltage protector part contained in the overvoltage protector section of the substrate and an LED part contained in the LED section of the substrate. The pn-junction between the overvoltage protector part of the p-type impurity-diffused layer and the n-type semiconductor region of the substrate and another pn-junction between the p-type semiconductor region and n-type semiconductor region of the substrate are both peripherally exposed at the trench. Then a first electrode is created which is electrically coupled both to the second compound semiconductor layer of the light-generating semiconductor region on the LED section of the substrate and to the overvoltage protector part of the p-type impurity-diffused layer of the substrate. A second electrode is also created which is electrically coupled to the p-type semiconductor region of the substrate.

Another aspect of the invention concerns the construction of the overvoltage-protected LED manufacturable by the above described method. Included is a silicon substrate having an overvoltage protector section and an LED section, each extending between a first and a second opposite major surface of the substrate. The substrate comprises an n-type semiconductor region formed in its overvoltage protector section to a prescribed depth from the first major surface thereof and a p-type semiconductor region occupying the rest of the substrate. A light-generating semiconductor region is formed on the first major surface of the substrate by successively growing by epitaxy a first compound semiconductor layer of a first conductivity type and a second compound semiconductor layer of a second conductivity type.

Further the substrate has a p-type impurity-diffused layer or a p-type semiconductor layer formed therein by thermal diffusion of the Group III element or elements from the first compound semiconductor layer of the light-generating semiconductor region as a result of the epitaxial growth of the light-generating semiconductor region on the substrate. This p-type impurity-diffused layer is electrically divided into an overvoltage protector part contained in the overvoltage protector section of the substrate and an LED part contained in the LED section of the substrate.

Also included are a first electrode electrically coupled both to the second compound semiconductor layer of the light-generating semiconductor region on the LED section of the substrate and to the overvoltage protector part of the p-type impurity-diffused layer or the p-type semiconductor layer of the substrate, and a second electrode electrically coupled to the p-type semiconductor region of the substrate. Two overvoltage protector diodes are thus created, one comprising the n-type semiconductor region in the overvoltage protector section of the substrate and the overvoltage protector part of the p-type impurity-diffused layer of the substrate, and the other comprising the n-type semiconductor region and p-type semiconductor region of the substrate.

The invention presupposes use of a silicon substrate in combination with a light-generating semiconductor region composed of compound semiconductor layers containing a Group III element or elements. In the course of the epitaxial growth of the light-generating semiconductor region on the substrate, there inevitably occurs a thermal dispersion or a thermal diffusion of the group III element or elements from the light-generating semiconductor region into the substrate. The result, as is well known to the semiconductor specialists, is the creation of a p-type impurity-diffused layer in the substrate. The invention makes use of this by-product of the epitaxial growth of the light-generating semiconductor region for equivalently providing a serial connection of two or three overvoltage protector diodes of either pnp or npn configuration which is itself connected in parallel with the light-generating semiconductor region. The overvoltage-protected LEDs according to the invention are therefore more compact in construction, easier and more economical of manufacture, and capable of withstanding higher reverse voltages than heretofore.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

Figure 1:
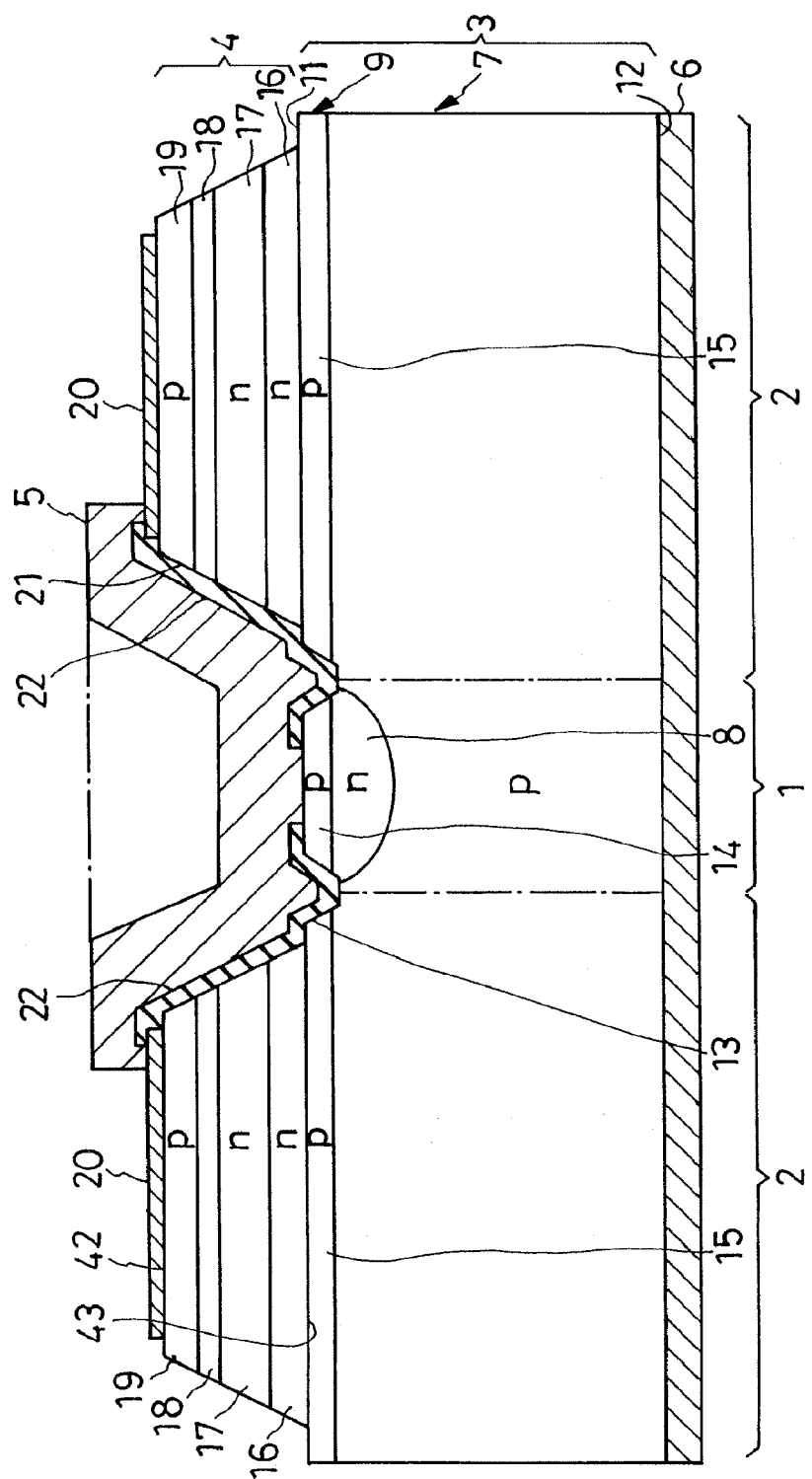
FIG. 1 is a diagrammatic sectional view of the overvoltage-protected LED embodying the principles of this invention.

The present invention is believed to be best embodied in the overvoltage-protected LED illustrated in FIG. 1 of the above drawings. The representative LED includes a silicon substrate 3 which may be notionally divided into an overvoltage protector section 1 and LED section 2. The overvoltage protector section 1, at the central part of the substrate 3, is configured to provide overvoltage protector diodes according to the invention. The LED section 2 surrounds the overvoltage protector section 1 and supports a light-generating semiconductor region 4 thereon. Deposited on the LED section 2, the light-generating semiconductor region 4 is in the form of a lamination of several constituent layers for conventionally generating light. A front or top electrode 5 and back or bottom electrode 6 are disposed opposite each other across the substrate 3 and light-generating semiconductor region 4.

The substrate 3 is mostly constituted of a region 7 of p-type silicon and additionally has an n-type semiconductor region 8 and a p-type impurity-diffused layer or a p-type semiconductor layer 9 formed therein. The substrate 3 has a pair of opposite major surfaces 11 and 12, and the p-type impurity-diffused layer 9 (comprising a central part 14 contained in the overvoltage protector section 1 and an annular part 15 contained in the LED section 2) is exposed at the first major surface 11. The complete substrate 3 has been doped into p-type throughout before the n-type semiconductor region 8 and p-type semiconductor layer 9 are created therein in manners to be described later. Besides being used as a basis for epitaxial growths of compound semiconductors into the light-generating semiconductor region 4, the substrate 3 is utilized for creating the pnp overvoltage protector diodes in its overvoltage protector section 1. The substrate 3 must also be sufficiently thick (e.g., 350 micrometers) and sturdy for mechanically supporting the light-generating semiconductor region 4 and associated means thereon.

The p-type semiconductor region 7 of the substrate 3 is of p-type silicon, doped with an acceptor such as boron (B) or like element from Group III to a concentration of, say, $5 \times 10^{18}$–$5 \times 10^{19}$ cm$^{-3}$. As low as 0.0001-0.0100 ohm-centimeter in resistivity, the p-type semiconductor region 7 of the substrate 3 provides part of the current path between the electrodes 5 and 6 as well as the p-type semiconductor region of the pnp overvoltage protector diode arrangement.

The n-type semiconductor region 8 of the substrate 3 is formed in the overvoltage protector section 1 of the substrate 3 so as to directly overlie the p-type semiconductor region 7. The n-type semiconductor region 8 may be created by diffusing an n-type dopant into the overvoltage protector section 1 from its surface 11 to a thickness of, say, 0.1-10.0 micrometers. The n-type semiconductor layer 8 of the substrate 3 is of n-type silicon.

The p-type impurity-diffused layer or the p-type semiconductor layer 9 of the substrate 3 extends downwardly from the entire surface 11 of the substrate to a depth (e.g., 5-20 nanometers) less than that of the n-type semiconductor region 8. Unlike the n-type semiconductor region 8, the p-type impurity-diffused layer 9 is not created by any independent impurity diffusion step but as a natural, ancillary result of the thermal dispersion or diffusion of the Group III elements from the light-generating semiconductor region 4 into the substrate 3 in the course of the epitaxial growth of the light-generating semiconductor region on the substrate. The p-type impurity-diffused layer 9 of the substrate 3 is of p-type silicon.

FIG. 1 also reveals an annular trench 13 formed in the substrate surface 11 so as to extend along the perimeter of the overvoltage protector section 1. This trench 13 divides, both physically and electrically, the p-type impurity-diffused layer 9 of the substrate 3 into a part (hereinafter referred to as the overvoltage protector part) 14 of circular shape included in the overvoltage protector section 1 of the substrate 3 and another part (hereinafter referred to as the LED part) 15 of annular shape included in the LED section 2 of the substrate. The overvoltage protector part 14 of the p-type impurity-diffused layer 9 overlies the n-type semiconductor region 8 in the overvoltage protector section 1 of the substrate 3. The LED part 15 of the p-type impurity-diffused layer 9 overlies the p-type semiconductor region 7 in the LED section 2 of the substrate 3.

It is thus seen that a pn-junction exists between the overvoltage protector part 14 of the p-type impurity-diffused layer 9 and the underlying n-type semiconductor region 8, and another pn-junction between the p-type semiconductor region 7 of the substrate 3 and the overlying n-type semiconductor region 8. Both of these pn-junctions have their peripheries exposed at the annular trench 13. The overvoltage protector part 14 of the p-type impurity-diffused layer 9, the n-type semiconductor region 8, and the p-type semiconductor region 7 are in pnp arrangement, providing in combination a serial connection of two overvoltage protector diodes shown at 34 and 35, FIG. 4, in the equivalent electrical circuit diagram of this LED drawn in that figure. Reference will be later had to this circuit diagram in more detail.

Overlying the LED section 2 of the substrate 3, the light-generating semiconductor region 4 is shown as a lamination of an n-type buffer layer 16, n-type compound semiconductor layer 17, active layer 18, and p-type compound semiconductor layer 19, deposited in that order on the LED part 15 of the p-type impurity-diffused layer 9 of the substrate 3. A funnel-shaped hollow 21 extends centrally through the light-generating semiconductor region 4 between its top 42 and bottom 43. Created by etching after the growth of all the layers 16-19 of the light-generating semiconductor region 4 on the complete surface 11 of the substrate 3, the hollow 21 leaves the light-generating semiconductor region only on the LED section 2 of the substrate. The overvoltage protector part 14 of the p-type impurity-diffused layer 9 is exposed at the bottom of the hollow 21.

The buffer layer 16 of the light-generating semiconductor region 4 is made from, in addition to an n-type dopant (donor), any of the semiconducting nitrides of the following general formula containing a Group III element or elements and nitrogen:

$Al_aIn_bGa_{1-a-b}N$ where $0 \leq a \leq 1$, $0 \leq b \leq 1$, and $a+b<1$.

Specific examples of the nitrides meeting this formula include aluminum nitride (AlN), aluminum indium gallium nitride (AlInGaN), gallium nitride (GaN), aluminum indium nitride (AlInN), and aluminum gallium nitride (AlGaN). Particularly preferred out of these is AlInGaN. The subscript a in the formula above is preferably from 0.1 to 0.7, and the subscript b from 0.0001 to 0.5. The particular composition of the buffer layer 16 in this embodiment of the invention is $Al_{0.5}In_{0.01}Ga_{0.49}N$.

The buffer layer 16 is intended to cause the overlying n-type compound semiconductor layer 17 to conform to the surface orientation of the substrate 3. The buffer layer 16 should be not less than 10 nanometers thick in order to perform this buffering function well, but should be not more than 500 nanometers thick in order to save itself from cracking. The particular thickness employed in this embodiment is 30 nanometers.

Although shown as a unitary layer in FIG. 1, the buffer layer 16 may in practice take the form of a lamination of two or more sublayers of different compositions. For example, the buffer layer 16 may be a combination of AlN and InGaN sublayers, including a required number of alternations of these sublayers.

Overlying the buffer layer 16, the n-type compound semiconductor layer 17 of the light-generating semiconductor region 4 constitutes the lower cladding of the active layer 18 in this double heterodyne junction LED. The n-type compound semiconductor layer 17 is made from any of the nitride semiconductors of the following general formula plus an n-type dopant:

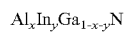

$Al_xIn_yGa_{1-x-y}N$ where $0 \leq x<1$, and $0 \leq y \leq 1$.

The n-type compound semiconductor layer 17 is made from n-type GaN to a thickness of approximately two micrometers in this embodiment. Being also of an n-type compound semiconductor, the buffer layer 16 might be considered part of the n-type compound semiconductor layer 17. It is also possible to eliminate the buffer layer 16 altogether and to place the compound semiconductor layer 17 directly on the substrate 3.

The active layer 18 on the n-type compound semiconductor layer 17 is made from any of the nitride semiconductors that are generally expressed as:

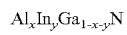

$Al_xIn_yGa_{1-x-y}N$ where $0 \leq x<1$, and $0 \leq y \leq 1$.

The particular material employed here for the active layer 18 is gallium indium nitride (InGaN). Despite the showing of FIG. 1, the active layer 18 is actually of known multiple quantum well design, comprising a plurality or multiplicity of sublayers, although it might be of the same composition throughout. The active layer 18 is not doped with a conductivity type determinant in this embodiment, although a p- or n-type dopant might be added as required or desired. Furthermore, in applications where the double heterodyne configuration is not a requirement, the active layer 18 may be omitted. Light will nevertheless be generated only by the n- and p-type compound semiconductor layers 17 and 19 placed in direct contact with each other.

The p-type compound semiconductor layer 19, the upper cladding of the active layer 18, is made from any of the nitride semiconductors of the following general formula, aside from a p-type dopant:

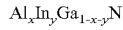

where $0 \leq x<1$, and $0 \leq y<1$. The p-type compound semiconductor layer 19 is made from p-type GaN to a thickness of 500 nanometers or so in this particular embodiment.

At 20 in FIG. 1 is seen a current-spreading film of optically transparent, electrically conducting material covering the top 42 of the light-generating semiconductor region 4. The current-spreading film 20 may be made from a mixture of indium oxide ($In_2O_3$) and tin oxide ($SnO_2$), or silver, or silver-base alloy, to a thickness (e.g., 10 nanometers) sufficiently thin to permit the passage therethrough of the light from the active layer 18. Making low resistance contact with the p-type compound semiconductor layer 19, the current-spreading film 20 serves to cause a more uniform current flow throughout the active layer 18. This film 20 will be unnecessary in cases where no such uniform current distribution is essential.

Mostly received in the funnel-shaped hollow 21 in the light-generating semiconductor region 4, the front or first electrode 5 is a layer of metal in ohmic contact with both the current-spreading film 20 and the overvoltage protector part 14 of the p-type impurity-diffused layer 9. The hollow 21 is open to the aforesaid annular trench 13 which is formed in the surface 11 of the substrate 3 so as to extend along the periphery of the overvoltage protector section 1 of the substrate. Although received as aforesaid in the hollow 21 as well as in the trench 13, the front electrode 5 is electrically isolated by an insulating film 22 from the inside surface of the light-generating semiconductor region 4 and, except for the overvoltage protector part 14 of the p-type impurity-diffused layer 9, from the substrate 3.

Besides electrically interconnecting the current-spreading film 20 and the overvoltage protector part 14 of the p-type impurity-diffused layer 9, the front electrode 5 mechanically serves as a wire bonding pad. The front electrode 5 must therefore be sufficiently thick and sturdy to perform this latter purpose. The resulting opacity of the front electrode 5 presents little or no impediment to the optical performance of the LED as it leaves most of the light-generating semiconductor region 4 uncovered thereby. Radiated upwardly from the active layer 18 of the light-generating semiconductor region 4, the light will issue from its surface 42 without any substantial obstruction by the front electrode 5.

It will also be appreciated that the overvoltage protector section 1 of the substrate 3, the n-type semiconductor region 8, and the overvoltage protector part 14 of the p-type impurity-diffused layer 9 all underlie the front, bonding-pad electrode 5. The overvoltage protector means according to the invention are thus compactly built into the LED, neither adding to its size nor hampering its performance. Despite the showing of FIG. 1, the front electrode 5 need not be hollow but, as indicated by the broken line, solid.

Method of Fabrication

Figure 2:
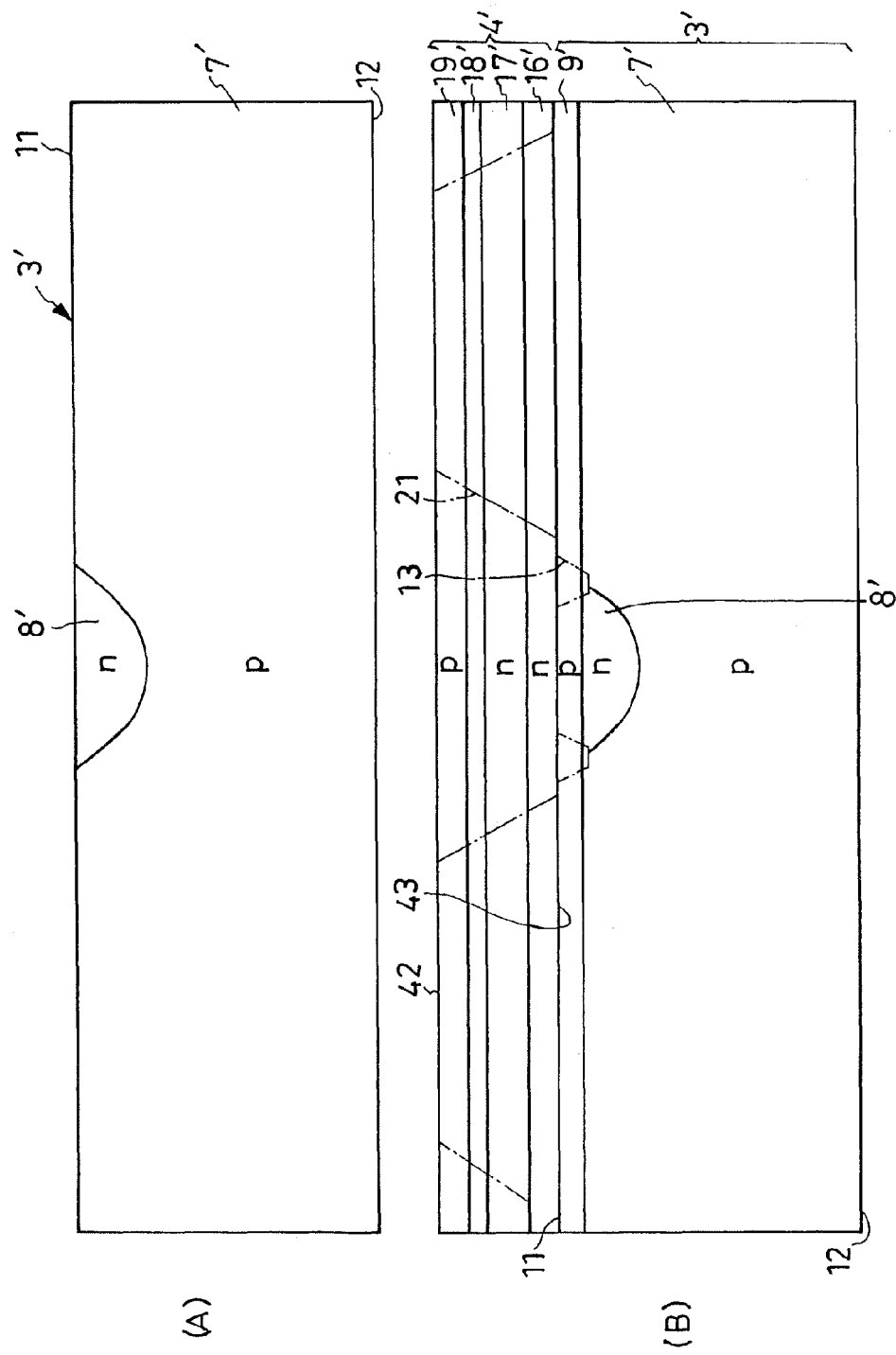
FIG. 2, consisting of (A) and (B), is a series of diagrammatic sectional views explanatory of a method of fabricating the overvoltage-protected LED of FIG. 1.
Figure 3:
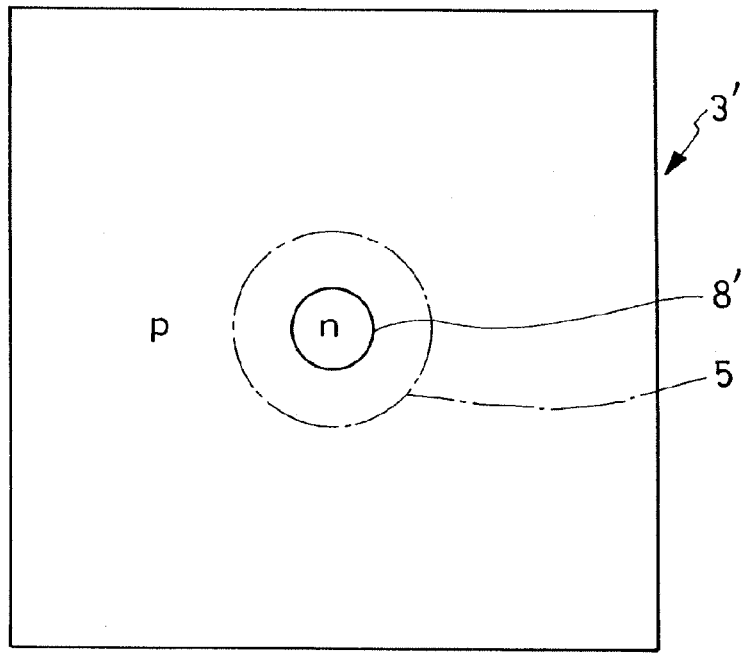
FIG. 3 is a top plan view of the substrate in the state of (A) in FIG. 2.

The fabrication of the overvoltage-protected LED of FIG. 1 starts with the preparation of a p-type silicon substrate 3' shown at (A) in FIG. 2 as well as in FIG. 3. Then an n-type dopant is diffused centrally into the substrate 3' to a relatively shallow depth from its front or top surface 11 thereby creating an n-type semiconductor region 8'. As seen in a plan view as in FIG. 3, the n-type semiconductor region 8' should be confined wholly inside the periphery of the front electrode 5 to be later formed.

The next step, illustrated at (B) in FIG. 2, is the creation of the constituent layers 16', 17', 18' and 19' of a light-generating semiconductor region 4' which is to be subsequently processed into the light-generating semiconductor region 4 of FIG. 1. Organometallic vapor phase epitaxy (OMVPE) is recommended for the fabrication of the light-generating semiconductor layers 16'-19'. Placed in a reactor, not shown, that is customarily employed for OMVPE, the above prepared substrate 3' may be preheated to a temperature range of 1000-1100° C. Then a gaseous mixture of prescribed proportions of trimethylaluminum [$Al_2(CH_3)_6$, abbreviated TMA], trimethylindium [$In(CH_3)_3$, abbreviated TMI], trimethylgallium [$Ga(CH_3)_3$, abbreviated TMG], ammonia ($NH_3$), and silane ($SiH_4$) is introduced into the reactor thereby causing a buffer layer 16' of n-type AlInGaN to grow by epitaxy on the surface 11 of the substrate 3'. The Si content of the $SiH_4$ gas serves as n-type dopant.

Then, with the substrate 3' held in the temperature range of 1000-1100° C., prescribed proportions of TMG, $SiH_4$ and $NH_3$ are introduced into the reactor. An n-type semiconductor layer 17' of n-GaN will then deposit on the buffer layer 16'.

Then, preparatory to creation of the multiple quantum well active layer 18', the temperature of the substrate 3' may be allowed to drop to 800° C. Then prescribed proportions of TMG, TMI and $NH_3$ are introduced into the reactor thereby causing a barrier sublayer of the active layer 18' to grow to a thickness of 13 nanometers or so on the n-type semiconductor layer 17'. The composition of this barrier sublayer may for example be $In_{0.02}Ga_{0.98}N$. Then the introduction of the above gas mixture may be continued, only with the proportion of TMI changed, until a well sublayer of $In_{0.2}Ga_{0.8}N$ grows to a thickness of three nanometers on the barrier sublayer. The creation of the barrier and well sublayers may be cyclically repeated a required number (e.g., four) of times to provide the desired multiple quantum well active layer 18'.

Then, with the substrate temperature raised again to the range of 1000-1100° C., a gaseous mixture of prescribed proportions of TMG, $NH_3$ and bis-cyclopentadienyl magnesium ($Cp_2Mg$) is metered into the reactor. A p-type compound semiconductor layer 19' of p-GaN will then appear on the active layer 18'. The Mg content of the above gaseous mixture will serve as p-type dopant.

In the course of the above epitaxial growth of the light-generating semiconductor region 4', such Group III elements of this region 4' as Ga, Al and In of the buffer layer 16' (or of the n-type semiconductor layer 17' in the absence of this buffer layer) will thermally migrate or diffuse into the substrate 3', into both of its p-type region 7' and n-type region 8', to create a new impurity-diffused layer 9' next to its surface 11. Since all such Group III elements are p-type impurities for silicon, no change will occur in conductivity type as a result of the thermal diffusion or dispersion of the Group III elements from the light-generating semiconductor region 4' into the p-type region 7' of the substrate 3'. The impurity-diffused layer 9' newly created in the substrate 3' will therefore be of p-type.

A change in conductivity type does, however, occur as a result of the transfer of the Group III elements into the n-type region 8' of the substrate 3'. The Group III elements will spread into the substrate 3' only to such a depth that the n-type region 8' will partly remain under the p-type impurity-diffused layer or the p-type semiconductor layer 9' of the substrate 3'.

Then, as indicated by the broken lines designated 21 at (B) in FIG. 2, the funnel-shaped hollow is etched centrally in the light-generating semiconductor region 4'. The hollow 21 extends down to the surface 11 of the substrate 3' and leaves the annular light-generating semiconductor region 4, FIG. 1, on the substrate.

Then the annular trench 13, also indicated by the broken lines at (B) in FIG. 2, is etched into that part of the substrate surface 11 which has been exposed as above by the hollow 21 in the light-generating semiconductor region 4'. The annular trench 13 divides the impurity-diffused layer 9' of the substrate 3' into the overvoltage protector part 14, FIG. 1, and LED part 15. Further the annular trench 13 extends deeper down into the substrate 3' than the impurity-diffused layer 9', intruding into the periphery of the n-type region 8'. Thus is the pn-junction between this n-type region 8' and the overvoltage protector part 14 of the impurity-diffused layer 9' peripherally exposed at the annular trench 13.

Then the transparent current-spreading film, seen at 20 in FIG. 1, is deposited on the surface 42 of the light-generating semiconductor region 4.

Then the insulating film 22, FIG. 1, is formed so as to cover the slanting side wall, and part of the bottom, of the funnel-shaped hollow 21 and the side walls and bottom of the annular trench 13. The insulating film 22 could be formed earlier than the current-spreading film 20.

Then the front and back electrodes 5 and 6 are created, as by vapor deposition of metal, in the positions indicated in FIG. 1. Now has been completed the fabrication of the overvoltage-protected LED according to the invention.

Figure 4:
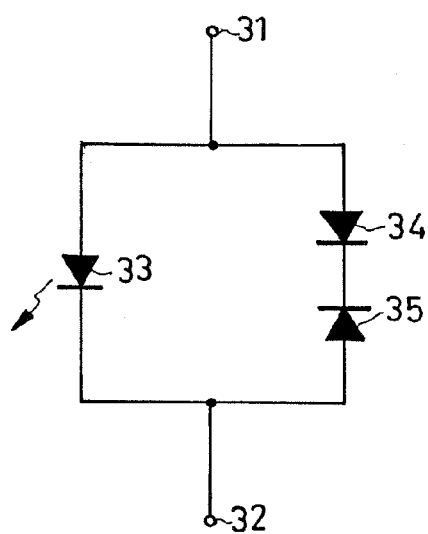
FIG. 4 is an equivalent circuit diagram of the overvoltage-protected LED of FIG. 1.

The overvoltage-protected LED according to the invention, constructed as in FIG. 1 and manufactured as at (A) and (B) in FIG. 2, may be thought of as being electrically circuited as equivalently diagramed in FIG. 4. The pair of terminals 31 and 32 of the equivalent circuit correspond respectively to the electrodes 5 and 6 in the construction of FIG. 1. Between these terminals an LED proper 33, electrically equivalent to the light-generating semiconductor region 4, is connected in parallel with the aforesaid two overvoltage protector diodes 34 and 35.

The two overvoltage protector diodes 34 and 35 are connected in series with, and oriented opposite to, each other. The first overvoltage protector diode 34 represents the pn-junction diode formed by the overvoltage-protector part 14 of the p-type impurity-diffused layer 9 and the n-type semiconductor region 8 of the substrate 3. The second overvoltage protector diode 35 represents the pn-junction diode formed by the p-type semiconductor region 7 and n-type semiconductor region 8 of the substrate 3.

Figure 5:
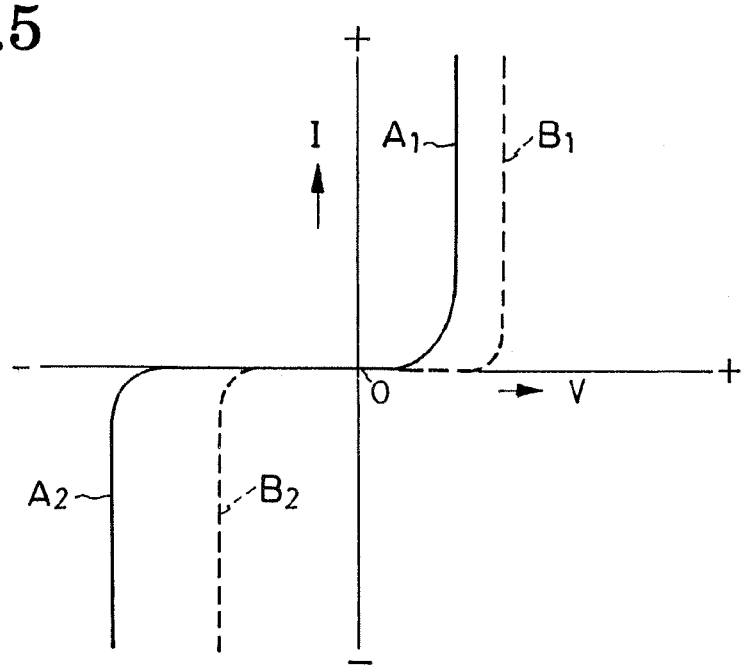
FIG. 5 is a chart of the current-voltage characteristics of the LED proper and overvoltage protector diodes in the equivalent circuit, FIG. 4, of the overvoltage-protected LED of FIG. 1.

In FIG. 5 is charted the current-voltage characteristics of the LED proper 33 and overvoltage protector diodes 34 and 35 in the equivalent circuit, FIG. 4, of the overvoltage-protected LED of FIG. 1. The solid-line curves $A_1$ and $A_2$ in the chart represent the forward and reverse characteristics, respectively, of the LED proper 33. The dashed-line curve $B_1$ represents the reverse characteristic of the second overvoltage protector diode 35. The dashed-line curve $B_2$ represents the reverse characteristic of the first overvoltage protector diode 34. The forward turn-on voltage of the first overvoltage protector diode 34 is sufficiently less than the reverse breakdown voltage of the second overvoltage protector diode 35. The forward turn-on voltage of the second overvoltage protector diode 35 is sufficiently less than the reverse breakdown voltage of the first overvoltage protector diode 34.

The first overvoltage protector diode 34 will break down, and the second overvoltage protector diode 35 will conduct, upon application of a reverse voltage spike higher than the breakdown voltage of the first overvoltage protector diode 34 to the LED proper 33. The voltage across the LED proper 33 will be limited to the breakdown voltage of the first overvoltage protector diode 34 as then the current bypasses the LED through the two overvoltage protector diodes 34 and 35. Thus is the LED protected from the reverse overvoltage. The first overvoltage protector diode 34 will remain nonconductive when a voltage less than its breakdown voltage is applied to the LED. It is therefore the breakdown voltage of the first overvoltage protector diode 34 that determines the maximum reverse voltage to be withstood by the overvoltage-protected light-emitting device comprising the LED proper 33 and overvoltage protector diodes 34 and 35.

Referring to FIG. 5 again, the second overvoltage protector diode 35 has a breakdown voltage higher than the forward voltage of the LED proper 33. The second overvoltage protector diode 35 is therefore nonconductive as long as a normal range of forward drive voltage is being applied to the LED proper 33. The overvoltage protector diodes 34 and 35 do not interfere with the normal operation of the LED proper 33.

The benefits offered by the overvoltage-protected LED constructed as in FIG. 1, and by the method of its fabrication illustrated in FIG. 2, may be recapitulated as follows:

1. The overvoltage protector part 14 of the p-type impurity-diffused layer 9, needed for providing the first overvoltage protector diode 34, is created as a secondary, although fully expected, product of the epitaxial growth of the light-generating semiconductor region 4' on the substrate 3. No dedicated manufacturing step is required for provision of the p-type overvoltage protector part 14, making possible a more economical, efficient manufacture of overvoltage-protected LEDs than heretofore.

2. The two overvoltage protector diodes 34 and 35 are provided by the pnp arrangement of the overvoltage protector part 14 of the p-type impurity-diffused layer 9 and the p-type semiconductor region 7 and n-type semiconductor region 8 of the substrate 3. Oppositely interconnected in series, the overvoltage protector diodes 34 and 35 elevate the reverse voltage withstanding capability of the LED, adapting it for applications where this capability matters.

3. The overvoltage protector section 1 of the substrate 3, the n-type semiconductor region 8, and the overvoltage protector part 14 of the p-type impurity-diffused layer 9 all underlie the front, bonding-pad electrode 5. The two overvoltage protector diodes 34 and 35 are therefore compactly built into the LED, neither adding to its size nor impeding its electroluminescent performance.

Embodiment of FIGS. 6-9

This embodiment is akin to that of FIG. 1 in utilizing for provision of overvoltage protector diodes the thermal transfer of Group III elements into the substrate from the light-generating semiconductor region being deposited thereon. Differences exist in the positioning of the electrodes and in the conductivity type of the substrate.

Figure 6:
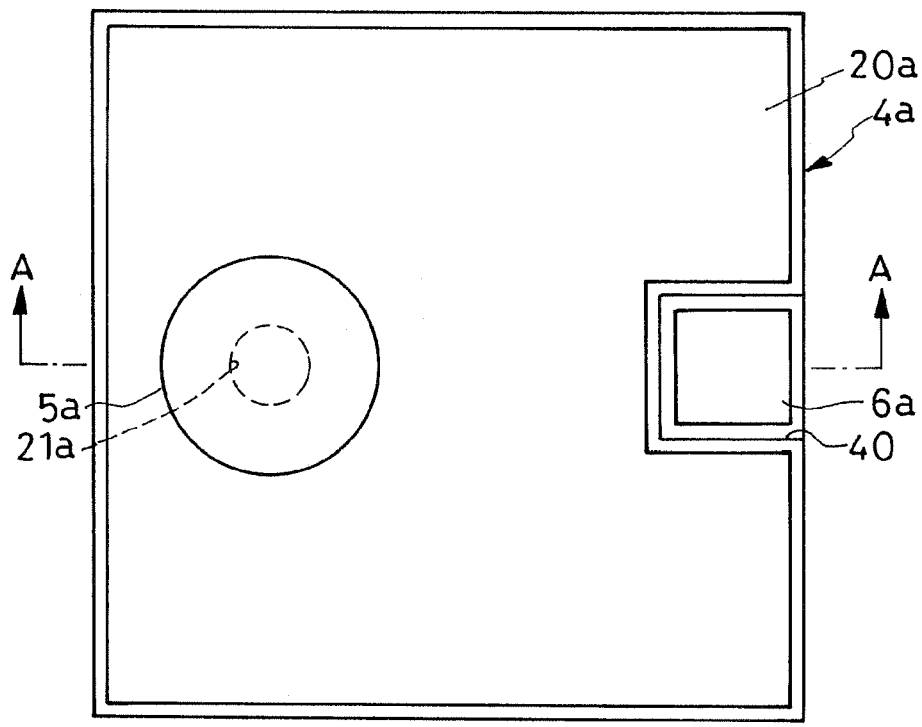
FIG. 6 is a top plan view of another preferred form of overvoltage-protected LED according to the invention.
Figure 7:
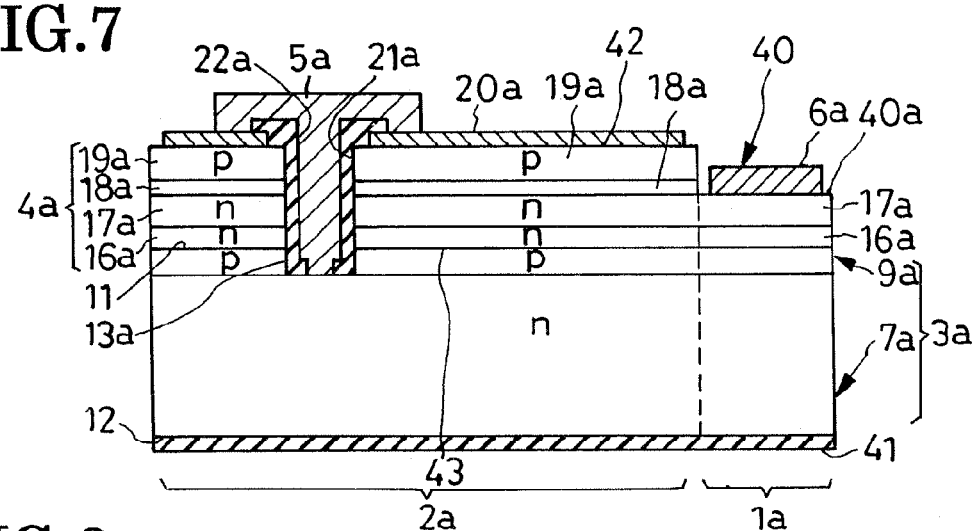
FIG. 7 is a section through the overvoltage-protected LED of FIG. 6, taken along the line A-A in that figure.

Generally boxlike in shape and having a pair of opposite major surfaces 11 and 12, the silicon substrate $3_a$ of this embodiment also has an overvoltage protector section $1_a$, FIG. 7, and an LED section $2_a$. As will be understood from an inspection of both FIGS. 6 and 7, the overvoltage protector section $1_a$ occupies limited part of the substrate $3_a$ contiguous to one of the four sides of the substrate. All the rest of the substrate $3_a$ is the LED section $2_a$.

FIG. 7 also indicates that unlike the substrate 3 of the preceding embodiment, the substrate $3_a$ is itself of n-type conductivity and has a p-type impurity-diffused layer or a p-type semiconductor layer $9_a$ as a by-product of the epitaxial growth of a light-generating semiconductor region $4_a$ thereon. The remaining part of the substrate $3_a$ is an n-type region $7_a$.

The light-generating semiconductor region $4_a$ on the surface 11 of the substrate $3_a$ is again shown as a lamination of an n-type buffer layer $16_a$, n-type compound semiconductor layer $17_a$, active layer $18_a$, and p-type compound semiconductor layer $19_a$. A opening $21_a$ extends through the light-generating semiconductor region $4_a$ from its top 42 down to its bottom 43, exposing part of the surface 11 of the substrate $3_a$. Further, through another opening $13_a$ in the p-type impurity-diffused layer $9_a$ of the substrate $3_a$, the opening $21_a$ is open to the n-type region $7_a$ of the substrate. FIGS. 6 and 7 both reveal a notch 40 formed in the light-generating semiconductor region $4_a$ so as to expose part of the n-type compound semiconductor layer $17_a$.

A current-spreading film $20_a$ of electrically conducting, optically transparent material covers the top 42 of the light-generating semiconductor region $4_a$. A first electrode $5_a$ is formed on the current-spreading film $20_a$ in ohmic contact therewith and has a portion extending into the opening $21_a$ in the light-generating semiconductor region $4_a$ into ohmic contact with the n-type region $7_a$ of the substrate $3_a$. Received in the notch 40 in the light-generating semiconductor region $4_a$, a second electrode $6_a$ overlies the surface $40_a$ of the n-type compound semiconductor layer $17_a$ in ohmic contact therewith. An insulating film 41 covers the underside 12 of the substrate $3_a$.

Figure 8:
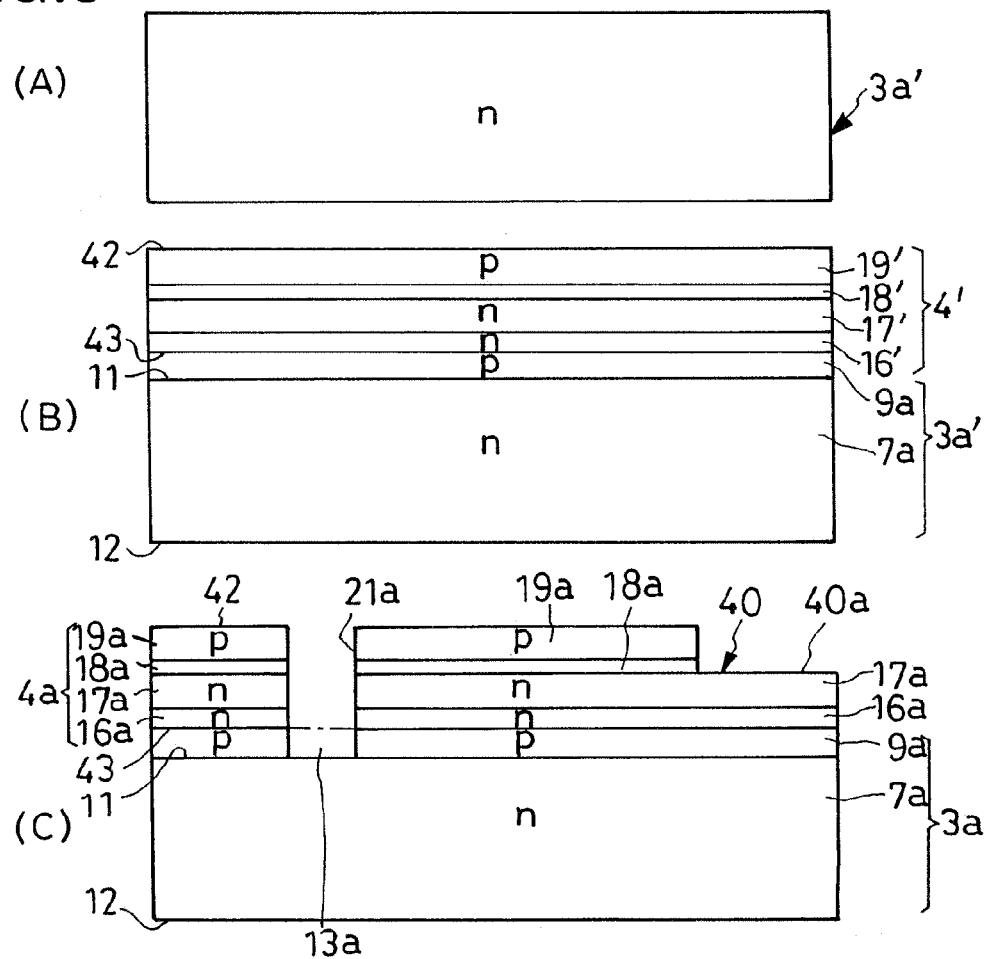
FIG. 8, consisting of (A)-(C), is a series of diagrammatic sectional views explanatory of a method of making the overvoltage-protected LED of FIG. 7.

Reference may be had to FIG. 8 for the following explanation of a method of making the overvoltage-protected LED of FIG. 7. At (A) in FIG. 8 is shown the n-type silicon substrate $3_a'$ for use here. On this substrate $3_a'$, as illustrated at (B) in FIG. 8, the light-generating semiconductor region 4' is grown by epitaxy in the order of the buffer layer 16', n-type semiconductor layer 17', active layer 18', and p-type compound semiconductor layer 19'. During this epitaxial growth there will be a thermal diffusion of Group III elements from the light-generating semiconductor region 4' into the substrate $3_a'$, creating the p-type impurity-diffused layer $9_a$ in the substrate.

Then, as seen at (C) in FIG. 8, the opening $21_a$ is created in the light-generating semiconductor region 4' by anisotropic etching. Then the opening $13_a$ is likewise created in the impurity-diffused layer $9_a$ of the substrate $3_a$. Now has been exposed part of the n-type semiconductor region $7_a$ of the substrate $3_a$ through the opening $21_a$ in the light-generating semiconductor region $4_a$ and the opening $13_a$ in the impurity-diffused layer $9_a$ of the substrate. Then the notch 40 is created in the light light-generating semiconductor region 4' by anisotropically etching away parts of the p-type compound semiconductor layer 19' and active layer 18' thereby exposing part of the n-type compound semiconductor layer 17'.

Now the substrate $3_a'$ and the light-generating semiconductor region 4', the latter comprising the buffer layer 16', n-type compound semiconductor layer 17', active layer 18' and p-type compound semiconductor layer 19', of FIG. 8 (B) have now been turned into the substrate $3_a$ and the light-generating semiconductor region $4_a$ comprising the buffer layer $16_a$, n-type compound semiconductor layer $17_a$, active layer $18_a$ and p-type compound semiconductor layer $19_a$ as in FIG. 8 (C).

The order of creating the opening $21_a$ and notch 40 in the light-generating semiconductor region 4' is reversible, and so is the order of creating the notch 40 and the opening $13_a$. It is also possible to form these opening $21_a$, notch 40 and opening $13_a$ into the funnel or like shape such as that of the hollow 21, FIG. 1.

Then, with reference back to FIG. 7, the top 42 of the light-generating semiconductor region $4_a$ is covered with the current-spreading film $20_a$. Then the surfaces bounding the opening $21_a$ and opening $13_a$ are covered with an insulating film $22_a$.

Then there is formed the first electrode $5_a$, seen in both FIGS. 6 and 7, in ohmic contact with both the current-spreading film $20_a$ and the n-type semiconductor region $7_a$ of the substrate $3_a$. Received in the openings $13_a$ and $21_a$, the first electrode $5_a$ is formed to include an enlargement overlying the current-spreading film $20_a$ to serve as a wire-bonding pad. The second electrode $6_a$ is formed on the exposed surface $40_a$ of the n-type compound semiconductor layer $17_a$ of the light-generating semiconductor region $4_a$, either concurrently with or after the first electrode $5_a$. The second electrode $6_a$ is metal made and placed in ohmic contact with the n-type compound semiconductor layer $17_a$. The overvoltage-protected LED is completed as the underside 12 of the substrate $3_a$ is subsequently covered with the insulating film 41.

Figure 9:
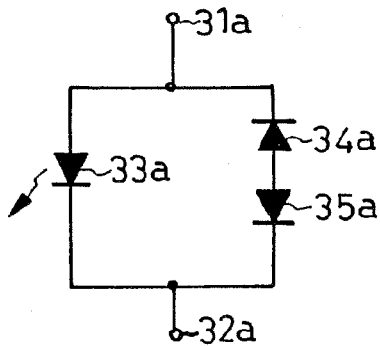
FIG. 9 is an equivalent circuit diagram of the overvoltage-protected LED of FIG. 7.

The thus-completed overvoltage-protected LED is electrically circuited as equivalently diagramed in FIG. 9. The terminals $31_a$ and $32_a$ of the overvoltage-protected LED circuit correspond respectively to the electrodes $5_a$ and $6_a$ in the construction of FIG. 7. The LED proper $33_a$ of the overvoltage-protected LED circuit represents those parts of the n-type compound semiconductor layer $17_a$, active layer $18_a$ and p-type compound semiconductor layer $19_a$ which overlie the LED section $2_a$ of the substrate $3_a$ in the FIG. 7 construction.

The overvoltage-protected LED circuit of FIG. 9 further comprises a serial connection of two overvoltage protector diodes $34_a$ and $35_a$. The first overvoltage protector diode $34_a$ represents the pn-junction arrangement of the n-type region $7_a$ and p-type impurity-diffused layer $9_a$ of the substrate $3_a$. The second overvoltage protector diode $35_a$ represents the pn-junction arrangement of the p-type impurity-diffused layer $9_a$ of the substrate $3_a$ and the buffer layer $16_a$ of the light-generating semiconductor region $4_a$. The first overvoltage protector diode $34_a$ is connected reversely in parallel with the LED proper $33_a$. Connected in series with the first voltage protector diode $34_a$ and oriented opposite thereto, the second overvoltage protector diode $35_a$ is connected forwardly in parallel with the LED proper $33_a$.

It is now clear that the embodiment of FIG. 7 is, although different from that of FIG. 1 in mechanical design, similar thereto in electric circuitry. The advantages gained by this FIG. 7 embodiment may be summarized as follows:

1. The two overvoltage protector diodes $34_a$ and $35_a$ are both made by utilizing the impurity-diffused layer $9_a$ created secondarily in the substrate $3_a$ as a result of the epitaxial growth of the light-generating semiconductor region $4_a$ thereon. The overvoltage-protected LED is manufacturable most efficiently and economically.

2. With both electrodes $5_a$ and $6_a$ arranged on the light-generating semiconductor region $4_a$, the device permits easy electrical connection to external circuitry.

3. The two overvoltage protector diodes $34_a$ and $35_a$ are both built from those parts of the n-type semiconductor region $7_a$ and p-type impurity-diffused layer $9_a$ of the substrate $3_a$ and the n-type buffer layer $16_a$ and n-type compound semiconductor layer $17_a$ which underlie the electrode $6_a$. Hardly any extra space is therefore required for these overvoltage protector diodes in addition to that for the LED proper.

Figure 10:
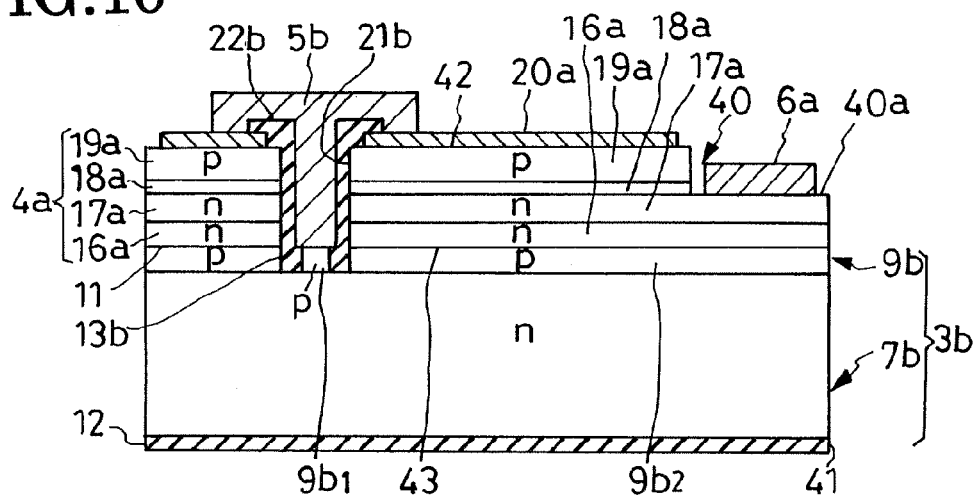
FIG. 10 is a diagrammatic sectional view of still another preferred form of overvoltage-protected LED according to the invention.
Figure 11:
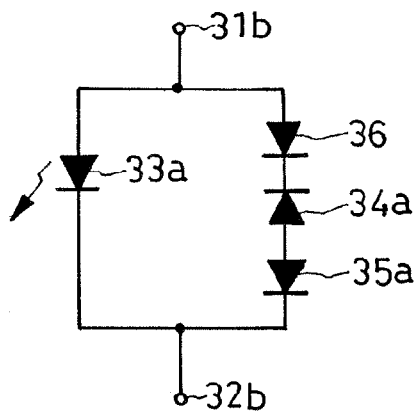
FIG. 11 is an equivalent circuit diagram of the overvoltage-protected LED of FIG. 10.

Embodiment of FIGS. 10-11

FIG. 10 is an illustration of a further preferred form of overvoltage-protected LED according to the invention, which is identical with that of FIG. 7 except for a slight modification in its substrate $3_b$. This modified substrate $3_b$ is similar to its FIG. 7 counterpart $3_a$ in having, in addition to an n-type region $7_b$, a p-type impurity-diffused layer or a p-type layer $9_b$ resulting from the epitaxial growth of the light-generating semiconductor region $4_a$ thereon.

Although of the same composition as its FIG. 7 counterpart $9_a$, this p-type impurity-diffused layer $9_b$ differs therefrom in having an annular trench $13_b$ extending therethrough in communication, and axial alignment, with an opening $21_b$ in the light-generating semiconductor region $4_a$. The annular trench $13_b$ in the p-type impurity-diffused layer $9_b$ divides the same into a relatively small first part $9_{b1}$ and, around the same, a much larger second part $9_{b2}$. The opening $21_b$ extends throughout the light-generating semiconductor region $4_a$, between its top 42 and bottom 43, and is open to the tubular trench $13_b$ in the p-type impurity-diffused layer $9_b$ of the substrate $3_b$. Thus the opening $21_b$ is open to the n-type region $7_b$ of the substrate $3_b$ via the annular trench $13_b$.

The surfaces defining the opening $21_b$ and annular trench $13_b$ are all covered with an insulating film $22_b$. Received in the opening $21_b$ via the insulating film $22_b$, a first electrode $5_b$ is in ohmic contact both with the current-spreading film $20_a$ on the top 42 of the light-generating semiconductor region $4_a$ and with the first part $9_{b1}$ of the p-type impurity-diffused layer $9_b$ of the substrate $3_b$. The second electrode $6_a$ is formed in the same position as its FIG. 7 counterpart $6_a$, making ohmic contact with the n-type compound semiconductor layer $17_a$ of the light-generating semiconductor region $4_a$.

The only constructional difference of this overvoltage-protected LED from that of FIG. 7 is that the annular trench $13_b$ is formed in the p-type impurity-diffused layer $9_b$ so as to divide the same into the parts $9_{b1}$ and $9_{b2}$. It is therefore apparent that this LED is manufacturable by substantially the same method as that described above for the LED of FIG. 7.

FIG. 11 is an equivalent electric circuit diagram of the overvoltage-protected LED of FIG. 10. Three overvoltage protector diodes $34_a$, $35_a$ and 36 are interconnected in series and connected in parallel with the LED proper $33_a$ between the pair of terminals $31_b$ and $32_b$. The terminals $31_b$ and $32_b$ correspond to the electrodes $5_b$ and $6_a$; the LED proper $33_a$ to the combination of the n-type compound semiconductor layer 17, and active layer $18_a$ and p-type compound semiconductor layer $19_a$; the first overvoltage protector diode $34_a$ to the pn-junction arrangement of the n-type region $7_b$ of the substrate $3_b$ and the second part $9_{b2}$ of the p-type impurity-diffused layer $9_b$; the second overvoltage protector diode $35_a$ to the pn-junction arrangement of the second part $9_{b2}$ of the p-type impurity-diffused layer $9_b$ and the n-type buffer layer $16_a$; and the third overvoltage protector diode 36 to the pn-junction arrangement of the first part $9_{b1}$ of the p-type impurity-diffused layer $9_b$ and the n-type region $7_b$ of the substrate $3_b$.

The third overvoltage protector diode 36, newly introduced in this embodiment of the invention, is serially connected to the two other such diodes $34_a$ and $35_a$ and oriented in the same direction as the second diode $35_a$. The reverse breakdown voltage of the combination of the second and third overvoltage protector diodes $35_a$ and 36 is set lower than the breakdown voltage of the LED proper $33_a$, as represented by the curve $B_2$ in the graph of FIG. 5. The breakdown voltage of the first overvoltage protector diode $34_a$ is set higher than the turn-on voltage of the LED proper $33_a$, as indicated by the curve $B_1$ in FIG. 5.

Thus the reverse voltage withstanding capability of this embodiment is made higher by the third overvoltage protector diode 36. The other advantages of this embodiment are as previously set forth in connection with that of FIG. 7.

Figure 12:
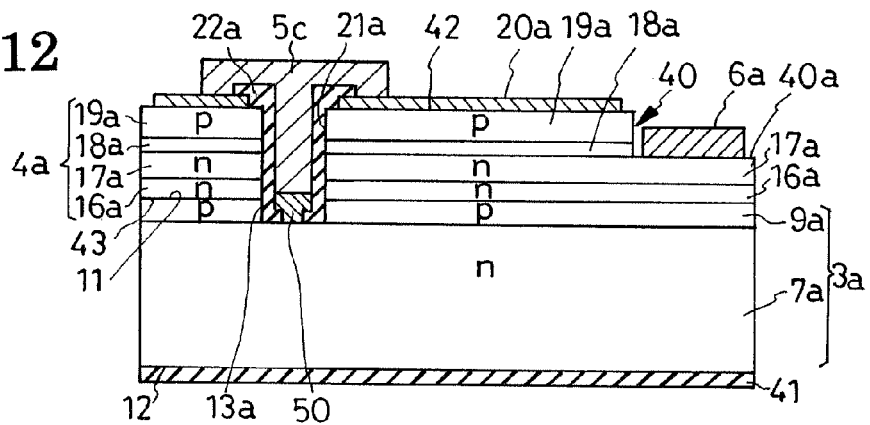
FIG. 12 is a diagrammatic sectional view of yet another preferred form of overvoltage-protected LED according to the invention.
Figure 13:
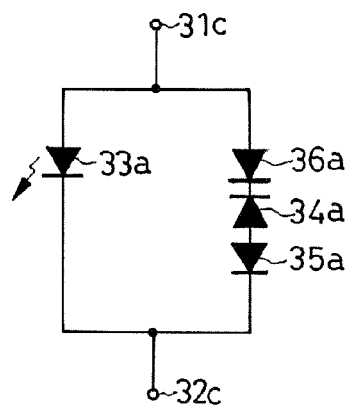
FIG. 13 is an equivalent circuit diagram of the overvoltage-protected LED of FIG. 12.

Embodiment of FIGS. 12-13

The overvoltage-protected LED shown in FIG. 12 is similar in construction to that of FIG. 7 except that the former incorporates a Schottky diode for protection against overvoltages. A region 50 of metal is interposed between the first electrode $5_c$ and the n-type semiconductor region $7_a$ of the substrate $3_a$ for providing a metal-semiconductor junction needed as a potential barrier by the Schottky diode. Disposed in the opening $13_a$ in the p-type impurity-diffused layer $9_a$ of the substrate $3_a$, the Schottky metal region 50 makes Schottky contact with the n-type semiconductor region $7_a$ of the substrate $3_a$. The insulating film $22_a$ electrically isolates the Schottky metal region 50 from both p-type impurity-diffused layer $9_a$ of the substrate $3_a$ and light-generating semiconductor region $4_a$. The first electrode $5_c$ makes ohmic contact with both current-spreading film $20_a$ and Schottky metal region 50. The first electrode $5_c$ and Schottky metal region 50 might be of the same material.

This overvoltage-protected LED is of exactly the same construction as that of FIG. 7 except for the Schottky metal region 50. The method of fabricating this LED is therefore considered self-evident from the foregoing description of the method of making the LED of FIG. 7.

Electrically, as is apparent from the equivalent circuit diagram in FIG. 13, this LED is equipped with a serial connection of three overvoltage protector diodes $34_a$, $35_a$ and $36_a$ in parallel with the LED proper $33_a$ between the pair of terminals $31_c$ and $32_c$ (electrodes $5_c$ and $6_a$). The first overvoltage protector diode $34_a$ is the pn-junction diode comprised of the n-type region $7_a$ and p-type impurity-diffused layer $9_a$ of the substrate $3_a$. The second overvoltage protector diode $35_a$ is the pn-junction diode comprised of the p-type impurity-diffused layer $9_a$ of the substrate $3_a$ and the buffer layer $16_a$ of the light-generating semiconductor region $4_a$. The added third overvoltage protector diode $36_a$ is the Schottky barrier diode comprised of the n-type region $7_a$ of the substrate $3_a$ and the Schottky metal region 50.

Like the third overvoltage protector diode 36, FIG. 11, of the FIGS. 10 and 11 embodiment, the overvoltage protector Schottky barrier diode $36_a$ is connected in series with the two other overvoltage protector diodes $34_a$ and $35_a$ and oriented in the same direction as the second $35_a$. It is therefore clear that this embodiment obtains the same benefits as does that of FIGS. 10 and 11.

Figure 14:
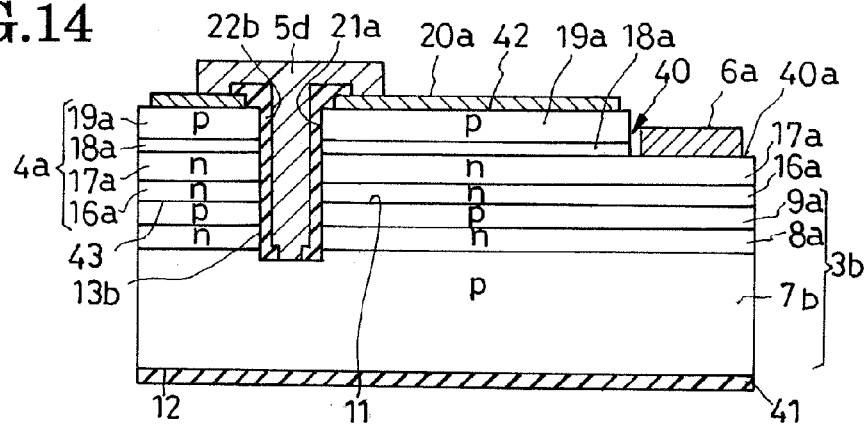
FIG. 14 is a diagrammatic sectional view of a further preferred form of overvoltage-protected LED according to the invention.
Figure 15:
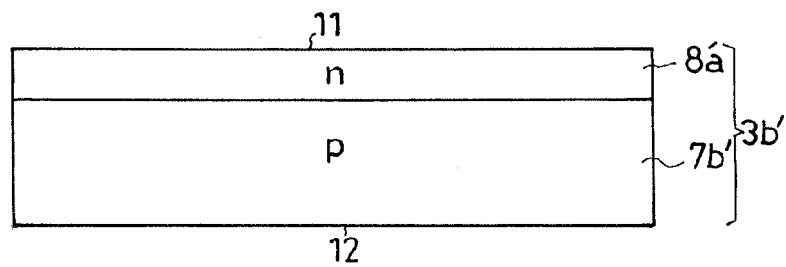
FIG. 15, consisting of (A)-(C), is a series of diagrammatic sectional views explanatory of a method of making the overvoltage-protected LED of FIG. 14.
Figure 15:
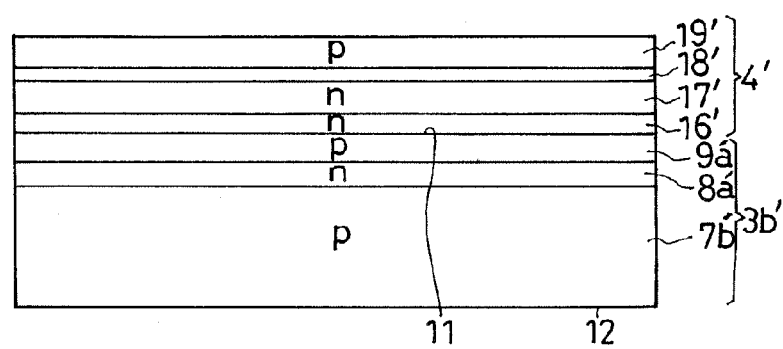
Figure 15:
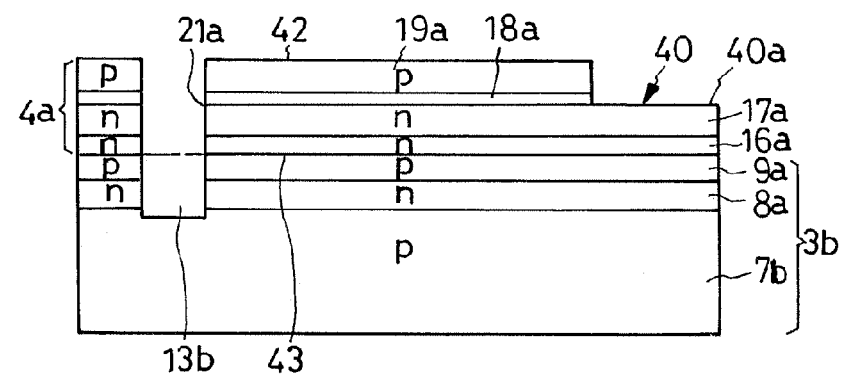
Figure 16:
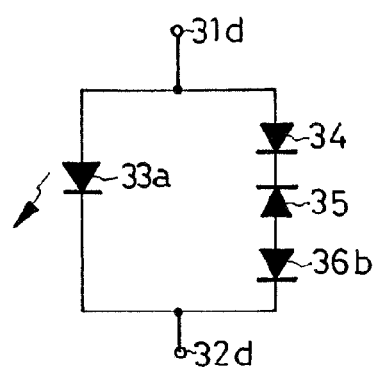
FIG. 16 is an equivalent circuit diagram of the overvoltage-protected LED of FIG. 14.

Embodiment of FIGS. 14-16

This embodiment incorporates a modified silicon substrate $3_b$ and is otherwise similar to that of FIG. 7. The modified substrate $3_b$ is a lamination of a p-type semiconductor region $7_b$, n-type semiconductor layer $8_a$, and p-type impurity-diffused layer $9_a$. Unlike the n-type semiconductor region 8 of the FIG. 1 embodiment, which is formed by impurity diffusion from narrowly confined part of the substrate surface 11, the n-type semiconductor layer $8_a$ of the substrate $3_b$ is made by impurity diffusion from the entire substrate surface 11. Overlying this n-type semiconductor layer $8_a$, the p-type impurity-diffused layer $9_a$ of the substrate $3_b$ is similar to its FIG. 1 counterpart 9 in being a secondary product of the epitaxial growth of the light-generating semiconductor region $4_a$ on the substrate.

The opening $21_a$ in the light-generating semiconductor region $4_a$ is open to the p-type semiconductor region $7_b$ of the substrate $3_b$ through another opening $13_b$ in its p-type impurity-diffused layer $9_a$ and n-type semiconductor layer $8_a$. The first electrode $5_d$ is in ohmic contact with both the current-spreading layer $20_a$ on the light-generating semiconductor region $4_a$ and the p-type region $7_b$ of the substrate $3_b$ but is electrically isolated from the light-generating semiconductor region $4_a$ and the layers $8_a$ and $9_a$ of the substrate by the insulating film $22_b$.

FIG. 15 is explanatory of a method of fabricating the overvoltage-protected LED constructed as in FIG. 14. As depicted at (A) in this figure, an n-type layer $8_a'$ may be formed in a p-type silicon substrate by the implantation and diffusion of an n-type dopant from its surface 11, thereby providing a substrate $3_b'$ having a p-type region $7_b'$ and the n-type layer $8_a'$.

The next step is the epitaxial growth of the light-generating semiconductor region 4' on the surface 11 of the substrate $3_b'$, as at (B) in FIG. 15. The light-generating semiconductor region 4' comprises as aforesaid the n-type buffer layer 16', n-type compound semiconductor layer 17', active layer 18', and p-type compound semiconductor layer 19'. During this epitaxial growth of the light-generating semiconductor region 4', the Group III elements contained in the n-type buffer layer 16' and n-type compound semiconductor layer 17' will thermally migrate or diffuse to a certain depth into the substrate $3_b'$ thereby creating the p-type impurity-diffused layer $9_a'$. The depth of the p-type impurity-diffused layer $9_a'$ will be such that the n-type semiconductor layer $8_a'$ of the substrate $3_b'$ will be left under the impurity-diffused layer $9_a'$.

Then, as seen at (C) in FIG. 15, the opening $21_a$, opening $13_b$ and notch 40 may be formed in the light-generating semiconductor region $4_a$. Then the insulating films $22_b$ and 41 and the electrodes $5_d$ and $6_a$ may be formed as in FIG. 14 to complete the overvoltage-protected LED.

FIG. 16 is an equivalent electric circuit of the overvoltage protected LED of FIG. 14. This LED is equipped with a serial connection of three overvoltage protector diodes 34, 35 and $36_b$ in parallel with the LED proper $33_a$ between the pair of terminals $31_d$ and $32_d$ (electrodes $5_d$ and $6_d$). The first overvoltage protector diode 34 is the pn-junction diode comprised of the p-type semiconductor region $7_b$ and n-type semiconductor layer $8_a$ of the substrate $3_b$. The second overvoltage protector diode 35 is the pn-junction diode comprised of the p-type impurity-diffused layer $9_a$ and n-type semiconductor layer $8_a$ of the substrate $3_b$. The added third overvoltage protector diode $36_b$ is the pn-junction diode comprised of the p-type impurity-diffused layer $9_a$ of the substrate $3_b$ and the buffer layer $16_a$ of the light-generating semiconductor region $4_a$.

The electric circuit of FIG. 16 is essentially the same as those drawn in FIGS. 11 and 13. It is therefore apparent that this embodiment offers the same benefits as do those of FIGS. 10 and 12.

Possible Modifications

Notwithstanding the foregoing detailed disclosure it is not desired that the present invention be limited by the exact showing of the drawings or the description thereof. The following is a brief list of possible modifications, alterations or adaptations of the illustrated embodiments which are all believed to fall within the purview of this invention:

1. In the embodiments of FIGS. 1, 10, 12 and 14 the n-type buffer layers 16 and $16_a$, n-type compound semiconductor layers 17 and $17_a$, and p-type compound semiconductor layers 19 and $19_a$ of the light-generating semiconductor region could all be switched in conductivity type.

2. In the embodiment of FIG. 1 the second electrode 6 could be disposed on part of the surface 11 of the substrate 3.

3. The light-generating semiconductor regions 4 and $4_a$ could be furnished with known compound semiconductor layers for current-spreading and ohmic contact purposes.

4. The electrodes 5, $5_a$, $5_c$ and $5_d$ could be placed in direct contact with the light-generating semiconductor region 4 or $4_a$, rather than through the current-spreading film 20 or $20_a$.

5. The current-spreading film 20 or $20_a$ could be open-worked for the passage of the generated light therethrough.

6. The opening 21 or $21_a$ in the light-generating semiconductor region $4_a$ could take the form of a notch cut sideways in that region.

7. The light-generating semiconductor region 4 or $4_a$ could be made from compound semiconductors other than nitride semiconductors, although the latter are preferred for the purposes of this invention.

8. The active layer of the light-generating semiconductor region is not an absolute necessity, light being generated only by the two compound semiconductor layers of opposite conductivity types placed in direct contact with each other.

What is claimed is:

1. A method of making an overvoltage-protected light-emitting semiconductor device, which comprises the steps of:
   (a) providing a silicon substrate having an overvoltage protector section and an LED section each extending between a first and a second opposite major surface thereof, the substrate having an n-type semiconductor region formed in the overvoltage protector section of the substrate to a prescribed depth from the first major surface thereof and a p-type semiconductor region in the rest of the substrate;
   (b) creating a light-generating semiconductor region on the first major surface of the substrate by successively growing by epitaxy a first compound semiconductor layer of a first conductivity type and a second compound semiconductor layer of a second conductivity type, the first compound semiconductor layer of the light-generating semiconductor region containing a Group III element;
   (c) concurrently with step (b), there being created a p-type impurity-diffused layer in the substrate by thermal diffusion dispersion of the Group III element from the first compound semiconductor layer of the light-generating semiconductor region as a by-product of the epitaxial growth of the light-generating semiconductor region on the substrate, the p-type impurity-diffused layer of the substrate being created to a depth less than the depth of the n-type semiconductor region of the substrate from the first major surface of the substrate;
   (d) exposing the first major surface of the overvoltage protector section of the substrate by removing part of the light-generating semiconductor region from over the voltage protector section of the substrate;
   (e) creating a trench in the first major surface of the substrate thereby electrically separating the p-type impurity-diffused layer of the substrate into an overvoltage protector part contained in the overvoltage protector section of the substrate and an LED part contained in the LED section of the substrate, a pn-junction between the overvoltage protector part of the p-type impurity-diffused layer and the n-type semiconductor region of the substrate and another pn-junction between the p-type semiconductor region and n-type semiconductor region of the substrate being both peripherally exposed at the trench;

(f) creating a first electrode electrically coupled both to the second compound semiconductor layer of the light-generating semiconductor region on the LED section of the substrate and to the overvoltage protector part of the p-type impurity-diffused layer of the substrate; and (g) creating a second electrode electrically coupled to the p-type semiconductor region of the substrate.

2. A method of making an overvoltage-protected light-emitting semiconductor device as in claim 1, wherein the light-generating semiconductor region is made by additionally growing an active layer between the two compound semiconductor layers of opposite conductivity types.

3. A method of making an overvoltage-protected light-emitting semiconductor device, which comprises the steps of:

(a) providing an n-type silicon substrate having a first and a second opposite major surface;

(b) creating a light-generating semiconductor region on the first major surface of the substrate by successively growing by epitaxy an n-type compound semiconductor layer and a p-type compound semiconductor layer, the n-type compound semiconductor layer of the light-generating semiconductor region containing a Group III element;

(c) concurrently with step (b), there being created a p-type impurity-diffused layer in the substrate by thermal diffusion of the Group III element from the n-type compound semiconductor layer of the light-generating semiconductor region as a by-product of the epitaxial growth of the light-generating semiconductor region on the substrate, the p-type impurity-diffused layer of the substrate being created to a prescribed depth from the first major surface of the substrate, leaving an n-type region in the substrate;

(d) exposing part of the n-type region of the substrate by removing parts of the light-generating semiconductor region and the p-type impurity-diffused layer of the substrate;

(e) exposing part of the n-type compound semiconductor layer of the light-generating semiconductor region by partly removing the p-type compound semiconductor layer of the light-generating semiconductor region;

(f) creating a first electrode electrically coupled both to the p-type compound semiconductor layer of the light-generating semiconductor region and to the n-type region of the substrate; and (g) creating a second electrode electrically coupled to the n-type compound semiconductor layer of the light-generating semiconductor region.

4. A method of making an overvoltage-protected light-emitting semiconductor device as in claim 3, wherein the light-generating semiconductor region is made by additionally growing an active layer between the two compound semiconductor layers of opposite conductivity types.

5. A method of making an overvoltage-protected light-emitting semiconductor device, which comprises the steps of:

(a) providing an n-type silicon substrate having a first and a second opposite major surface;

(b) creating a light-generating semiconductor region on the first major surface of the substrate by successively growing by epitaxy a first compound semiconductor layer of a first conductivity type and a second compound semiconductor layer of a second conductivity type, the first compound semiconductor layer of the light-generating semiconductor region containing a Group III element;

(c) concurrently with step (b), there being created a p-type impurity-diffused layer in the substrate by thermal diffusion of the Group III element from the first compound semiconductor layer of the light-generating semiconductor region as a by-product of the epitaxial growth of the light-generating semiconductor region on the substrate, the p-type impurity-diffused layer of the substrate being created to a prescribed depth from the first major surface of the substrate;

(d) exposing part of the p-type impurity-diffused layer of the substrate by creating an opening in the light-generating semiconductor region;

(e) creating a trench in the first major surface of the substrate thereby electrically separating the p-type impurity-diffused layer of the substrate into a first and a second part, the first part of the p-type impurity-diffused layer being exposed to the opening in the light-generating semiconductor region, the second part of the p-type impurity-diffused layer being contiguous to the first compound semiconductor layer of the light-generating semiconductor region;

(f) exposing part of the first compound semiconductor layer of the light-generating semiconductor region by partly removing the second compound semiconductor layer of the light-generating semiconductor region;

(g) creating a first electrode electrically coupled both to the second compound semiconductor layer of the light-generating semiconductor region and to the first part of the p-type impurity-diffused layer of the substrate; and (h) creating a second electrode electrically coupled to the first compound semiconductor layer of the light-generating semiconductor region.

6. A method of making an overvoltage-protected light-emitting semiconductor device as in claim 5, wherein the light-generating semiconductor region is made by additionally growing an active layer between the two compound semiconductor layers of opposite conductivity types.

7. A method of making an overvoltage-protected light-emitting semiconductor device, which comprises the steps of:

(a) providing an n-type silicon substrate having a first and a second opposite major surface;

(b) creating a light-generating semiconductor region on the first major surface of the substrate by successively growing by epitaxy a first compound semiconductor layer of a first conductivity type and a second compound semiconductor layer of a second conductivity type, the first compound semiconductor layer of the light-generating semiconductor region containing a Group III element;

(c) concurrently with step (b), there being created a p-type impurity-diffused layer in the substrate by thermal diffusion of the Group III element from the first compound semiconductor layer of the light-generating semiconductor region as a by-product of the epitaxial growth of the light-generating semiconductor region on the substrate, the p-type impurity-diffused layer of the substrate being created to a prescribed depth from the first major surface of the substrate, leaving an n-type region in the substrate;

(d) exposing part of the n-type region of the substrate by removing parts of the light-generating semiconductor region and the p-type impurity-diffused layer of the substrate;

(e) exposing part of the first compound semiconductor layer of the light-generating semiconductor region by partly removing the second compound semiconductor layer of the light-generating semiconductor region;

(f) providing a metal region in Schottky contact with the above exposed part of the n-type region of the substrate;

(g) creating a first electrode electrically coupled both to the second compound semiconductor layer of the light-generating semiconductor region and to the metal region; and (h) creating a second electrode electrically coupled to the first compound semiconductor layer of the light-generating semiconductor region.

8. A method of making an overvoltage-protected light-emitting semiconductor device as in claim 7, wherein the light-generating semiconductor region is made by additionally growing an active layer between the two compound semiconductor layers of opposite conductivity types.

9. A method of making an overvoltage-protected light-emitting semiconductor device, which comprises the steps of:

(a) providing a silicon substrate having an n-type semiconductor layer and p-type semiconductor region exposed respectively at a first and a second opposite major surface of the substrate:

(b) creating a light-generating semiconductor region on the first major surface of the substrate by successively growing by epitaxy a first compound semiconductor layer of a first conductivity type and a second compound semiconductor layer of a second conductivity type, the first compound semiconductor layer of the light-generating semiconductor region containing a Group III element;

(c) concurrently with step (b), there being created a p-type impurity-diffused layer in the substrate by thermal diffusion of the Group III element from the first semiconductor layer of the light-generating semiconductor region as a by-product of the epitaxial growth of the light-generating semiconductor region on the substrate, the p-type impurity-diffused layer of the substrate being created to a less depth from the first major surface of the substrate than the n-type semiconductor layer of the substrate, leaving part of the n-type semiconductor layer in the substrate;

(d) exposing part of the p-type semiconductor region of the substrate by removing parts of the light-generating semiconductor region and the p-type impurity-diffused layer and n-type semiconductor layer of the substrate;

(e) exposing part of the first compound semiconductor layer of the light-generating semiconductor region by partly removing the second compound semiconductor layer of the light-generating semiconductor region;

(f) creating a first electrode electrically coupled both to the second compound semiconductor layer of the light-generating semiconductor region and to the p-type semiconductor region of the substrate; and (g) creating a second electrode electrically coupled to the first compound semiconductor layer of the light-generating semiconductor region.

10. A method of making an overvoltage-protected light-emitting semiconductor device as defined in claim 9, wherein the light-generating semiconductor region is made by additionally growing an active layer between the two compound semiconductor layers of opposite conductivity types.

11. An overvoltage-protected light-emitting semiconductor device comprising:

(a) a silicon substrate having an overvoltage protector section and an LED section each extending between a first and a second opposite major surface thereof, the substrate having an n-type semiconductor region formed in the overvoltage protector section of the substrate to a prescribed depth from the first major surface thereof and a p-type semiconductor region in the rest of the overvoltage protector section and in the LED section;

(b) a light-generating semiconductor region on the first major surface of the substrate formed by successively growing by epitaxy a first compound semiconductor layer of a first conductivity type and a second compound semiconductor layer of a second conductivity type, the first compound semiconductor layer of the light-generating semiconductor region containing a Group III element;

(c) a p-type impurity-diffused layer formed in the substrate by thermal diffusion of the Group III element from the first compound semiconductor layer of the light-generating semiconductor region as a by-product of the epitaxial growth of the light-generating semiconductor region on the substrate, the p-type impurity-diffused layer of the substrate being created to a depth less than the depth of the n-type semiconductor region of the substrate from the first major surface of the substrate;

(d) there being a hollow formed in the light-generating semiconductor region for exposing the first major surface of the overvoltage protector section of the substrate;

(e) there being a trench formed in the first major surface of the substrate for electrically separating the p-type impurity-diffused layer of the substrate into an overvoltage protector part contained in the overvoltage protector section of the substrate and an LED part contained in the LED section of the substrate, a pn-junction between the overvoltage protector part of the p-type impurity-diffused layer and the n-type semiconductor region of the substrate and another pn-junction between the p-type semiconductor region and n-type semiconductor region of the substrate being both peripherally exposed at the trench;

(f) a first electrode electrically coupled both to the second compound semiconductor layer of the light-generating semiconductor region on the LED section of the substrate and to the overvoltage protector part of the p-type impurity-diffused layer of the substrate; and (g) a second electrode electrically coupled to the p-type semiconductor region of the substrate;

(h) whereby there are created an overvoltage protector diode comprised of the n-type semiconductor region in the overvoltage protector section of the substrate and the overvoltage protector part of the p-type impurity-diffused layer of the substrate, and another overvoltage protector diode comprised of the n-type semiconductor region and p-type semiconductor region of the substrate.

12. An overvoltage-protected light-emitting semiconductor device as in claim 11, wherein the light-generating semiconductor region further comprises an active layer between the two compound semiconductor layers of opposite conductivity types.

13. An overvoltage-protected light-emitting semiconductor device comprising:

(a) an n-type silicon substrate having a first and a second opposite major surface;

(b) a light-generating semiconductor region on the first major surface of the substrate formed by successively growing by epitaxy an n-type compound semiconductor layer and a p-type compound semiconductor layer, the n-type compound semiconductor layer of the light-generating semiconductor region containing a Group III element;

(c) a p-type impurity-diffused layer formed in the substrate by thermal diffusion of the Group III element from the n-type compound semiconductor layer of the light-generating semiconductor region as a by-product of the epitaxial growth of the light-generating semiconductor region on the substrate, the p-type impurity-diffused layer of the substrate being created to a prescribed depth from the first major surface of the substrate, leaving an n-type region in the substrate;

(d) there being an opening extending through the light-generating semiconductor region and the p-type impurity-diffused layer of the substrate for exposing part of the n-type region of the substrate;

(e) a first electrode extending through the opening in the light-generating semiconductor region and the p-type impurity-diffused layer of the substrate and electrically coupled both to the p-type compound semiconductor layer of the light-generating semiconductor region and to the n-type region of the substrate;

(f) there being a notch formed in the p-type compound semiconductor layer of the light-generating semiconductor region for exposing part of the n-type compound semiconductor layer of the light-generating semiconductor region; and (g) a second electrode received in the notch in the p-type compound semiconductor layer of the light-generating semiconductor region and electrically coupled to the n-type compound semiconductor layer of the light-generating semiconductor region.

14. An overvoltage-protected light-emitting semiconductor device as defined in claim 13, wherein the light-generating semiconductor region further comprises an active layer between the two compound semiconductor layers of opposite conductivity types.

15. An overvoltage-protected light-emitting semiconductor device comprising:

(a) an n-type silicon substrate having a first and a second opposite major surface;

(b) a light-generating semiconductor region on the first major surface of the substrate formed by successively growing by epitaxy a first compound semiconductor layer of a first conductivity type and a second compound semiconductor layer of a second conductivity type, the first compound semiconductor layer of the light-generating semiconductor region containing a Group III element;

(c) a p-type impurity-diffused layer formed in the substrate by thermal diffusion of the Group III element from the first semiconductor layer of the light-generating semiconductor region as a by-product of the epitaxial growth of the light-generating semiconductor region on the substrate, the p-type impurity-diffused layer of the substrate being created to a prescribed depth from the first major surface of the substrate;

(d) there being an opening extending through the light-generating semiconductor region for exposing part of the p-type impurity-diffused layer of the substrate;

(e) there being a trench formed in the first major surface of the substrate for electrically separating the p-type impurity-diffused layer of the substrate into a first and a second part, the first part of the p-type impurity-diffused layer being exposed to the opening in the light-generating semiconductor region, the second part of the p-type impurity-diffused layer being contiguous to the first compound semiconductor layer of the light-generating semiconductor region;

(f) a first electrode extending through the opening in the light-generating semiconductor region and electrically coupled both to the second compound semiconductor layer of the light-generating semiconductor region and to the first part of the p-type impurity-diffused layer of the substrate;

(g) there being a notch formed in the second compound semiconductor layer of the light-generating semiconductor region for exposing part of the first compound semiconductor layer of the light-generating semiconductor region; and (h) a second electrode received in the notch in the second compound semiconductor layer of the light-generating semiconductor region and electrically coupled to the first compound semiconductor layer of the light-generating semiconductor region.

16. An overvoltage-protected light-emitting semiconductor device as in claim 15, wherein the light-generating semiconductor region further comprises an active layer between the two compound semiconductor layers of opposite conductivity types.

17. An overvoltage-protected light-emitting semiconductor device comprising:

(a) an n-type silicon substrate having a first and a second opposite major surface;

(b) a light-generating semiconductor region on the first major surface of the substrate formed by successively growing by epitaxy a first compound semiconductor layer of a first conductivity type and a second compound semiconductor layer of a second conductivity type, the first compound semiconductor layer of the light-generating semiconductor region containing a Group III element;

(c) a p-type impurity-diffused layer formed in the substrate by thermal diffusion of the Group III element from the first semiconductor layer of the light-generating semiconductor region as a by-product of the epitaxial growth of the light-generating semiconductor region on the substrate, the p-type impurity-diffused layer of the substrate being created to a prescribed depth from the first major surface of the substrate, leaving an n-type region in the substrate;

(d) there being an opening extending through the light-generating semiconductor region and the p-type impurity-diffused layer of the substrate for exposing part of the n-type region of the substrate;

(e) a metal region received in the opening in the p-type impurity-diffused layer of the substrate and placed in Schottky contact with the n-type region of the substrate;

(f) a first electrode received in the opening in the light-generating semiconductor region and electrically coupled both to the second compound semiconductor layer of the light-generating semiconductor region and to the metal region;

(g) there being a notch formed in the second compound semiconductor layer of the light-generating semiconductor region for exposing part of the first compound semiconductor layer of the light-generating semiconductor region; and (h) a second electrode received in the notch in the second compound semiconductor layer of the light-generating semiconductor region and electrically coupled to the first compound semiconductor layer of the light-generating semiconductor region.

18. An overvoltage-protected light-emitting semiconductor device as in claim 17, wherein the light-generating semiconductor region further comprises an active layer between the two compound semiconductor layers of opposite conductivity types.

19. An overvoltage-protected light-emitting semiconductor device comprising:
   (a) a silicon substrate having an n-type semiconductor layer and p-type semiconductor region exposed respectively at a first and a second opposite major surface of the substrate:
   (b) a light-generating semiconductor region on the first major surface of the substrate formed by successively growing by epitaxy a first compound semiconductor layer of a first conductivity type and a second compound semiconductor layer of a second conductivity type, the first compound semiconductor layer of the light-generating semiconductor region containing a Group III element;
   (c) a p-type impurity-diffused layer formed in the substrate by thermal diffusion of the Group III element from the first semiconductor layer of the light-generating semiconductor region as a by-product of the epitaxial growth of the light-generating semiconductor region on the substrate, the p-type impurity-layer of the substrate being created to a less depth from the first major surface of the substrate than the n-type semiconductor layer of the substrate, leaving part of the n-type semiconductor layer in the substrate;
   (d) there being an opening extending through the light-generating semiconductor region and the p-type impurity-diffused layer and n-type semiconductor layer of the substrate for exposing part of the p-type semiconductor region of the substrate;
   (e) a first electrode received in the opening in the light-generating semiconductor region and the p-type impurity-diffused layer and n-type semiconductor layer of the substrate and electrically coupled both to the second compound semiconductor layer of the light-generating semiconductor region and to the p-type semiconductor region of the substrate;
   (f) there being a notch formed in the second compound semiconductor layer of the light-generating semiconductor region for exposing part of the first compound semiconductor layer of the light-generating semiconductor region; and
   (g) a second electrode received in the notch in the second compound semiconductor layer of the light-generating semiconductor region and electrically coupled to the first compound semiconductor layer of the light-generating semiconductor region.

20. An overvoltage-protected light-emitting semiconductor device as in claim 19, wherein the light-generating semiconductor region further comprises an active layer between the two compound semiconductor layers of opposite conductivity types.

* * * * *